United States Patent [19]
da Costa Alves et al.

[11] Patent Number: 5,255,839

[45] Date of Patent: Oct. 26, 1993

[54] METHOD FOR SOLDER APPLICATION AND REFLOW

[75] Inventors: Francisco da Costa Alves, Boca Raton; Anthony B. Suppelsa, Coral Springs; Kenneth R. Thompson, Sunrise, all of Fla.

[73] Assignee: Motorola, Inc., Schaumburg, Ill.

[21] Appl. No.: 816,684

[22] Filed: Jan. 2, 1992

[51] Int. Cl.$^5$ ............................................. B23K 31/02
[52] U.S. Cl. ............................... 228/180.21; 228/246
[58] Field of Search ............... 228/180.2, 223, 246, 228/253, 254, 56.3

[56] References Cited

U.S. PATENT DOCUMENTS

| | | | |
|---|---|---|---|
| 2,079,710 | 5/1937 | Jacobson | 29/428 |
| 3,436,818 | 4/1969 | Merrin et al. | 228/180.2 |
| 3,703,254 | 11/1972 | Maierson et al. | 228/56.3 |
| 4,352,449 | 10/1982 | Hall et al. | 228/124 |
| 4,720,324 | 1/1988 | Hayward | 156/645 |
| 4,878,611 | 11/1989 | Lo Vasco et al. | 228/180.2 |
| 4,994,119 | 2/1991 | Gotierrez et al. | 148/23 |
| 5,060,844 | 10/1991 | Behun et al. | 228/246 |
| 5,108,024 | 4/1992 | Kazem-Goudarzi et al. | 228/104 |

OTHER PUBLICATIONS

"Solder Balls" catalog. Alloys Unlimited Inc.
Metals Handbook 9th ed. vol. 6, p. 13, 1084–1085.

*Primary Examiner*—Mark Rosenbaum
*Assistant Examiner*—Jeanne M. Elpel
*Attorney, Agent, or Firm*—Dale W. Dorinski

[57] ABSTRACT

A method for applying solder on a substrate (12) comprises the steps of providing a substrate (12) having predefined solder pads (15) and then providing solder spheres (16) for suitable placement on the solder pads. Then applying flux (14) and tacking media (18) between the solder pads (15) and the solder spheres (16) and then placing the solder spheres on the solder pads. Subsequently the solder spheres are heated onto the solder pads of the substrate providing reflowed solder (26) on the solder pads. Then a layer of flux tacking media (28) is applied on the reflowed solder. Next, a component (30 or 40) is placed on the reflowed solder and flux tacking media providing a substrate assembly (10). Finally, the circuit assembly is heated allowing the component to be soldered to the solder pad.

7 Claims, 2 Drawing Sheets

METHOD FOR SOLDER APPLICATION AND REFLOW

TECHNICAL FIELD

This invention relates generally to the application of solder in general, and more in particularly to a method and apparatus for solder application with a controlled amount of solder volume to a solder pad.

BACKGROUND

The trends and technology towards miniaturization of integrated circuits is outpacing the technology for packaging such integrated circuits. For instance, very fine pitched leaded components and surface mounted devices (SMD's) are very difficult to solder onto printed circuit boards or printed wiring boards without a significant number of defects. Current practical lead pitch barriers of a approximately 25 mils exists with conventional solder print, place, and reflow technologies due to a high joint defect level (over 25 defective parts per million joints). Several factors, including solder paste rheology, printing machine controls, solder stencil aperture sizes and side wall characteristics, and volume of solder per pad variations contribute towards this barrier.

The cause of such a high joint defect rate is also attributable to the lack of a method to precisely control the solder volume per substrate solder pad and the lack of a uniform height of solder on the substrate solder pad with collapsible characteristics during reflow to fine pitched leads. Existing methods of applying solder such as screen printing fails to provide a sufficiently controllable solder volume and height due to variations in the percentage of solids in the solder paste and offset stencils that are slightly misaligned with the solder pads. Shorts between leads on adjacent solder pads are also created when component leads are set down onto solder. Other methods such as plating solder onto substrates presents the problem of controlling the optimum ratio of tin to lead. Additionally, if the printed circuit boards used are of a mixed technology (for instance one side of a substrate can be screen printed and reflowed while the opposing side can be wave soldered), fine pitched devices can only be interconnected using expensive solder plating from the printed circuit board vendor using superior control over solder printing operations and solder paste. Thus, a need exists for a easily implementable process and apparatus that would facilitate the formation of solder interconnects between surface mounted components and very finely pitched leaded components to electrical substrates with superior soldering yields and which further overcome the problems stated above.

SUMMARY OF THE INVENTION

A method for applying solder on a substrate comprises the steps of providing a substrate having predefined solder pads and then providing solder spheres for suitable placement on the solder pads. Then applying flux and tacking media between the solder pads and the solder spheres and then placing the solder spheres on the solder pads. Subsequently the solder spheres are heated onto the solder pads of the substrate providing reflowed solder on the solder pads.

DETAILED DESCRIPTION OF THE PREFERRED EMBODIMENT

Figure 1:
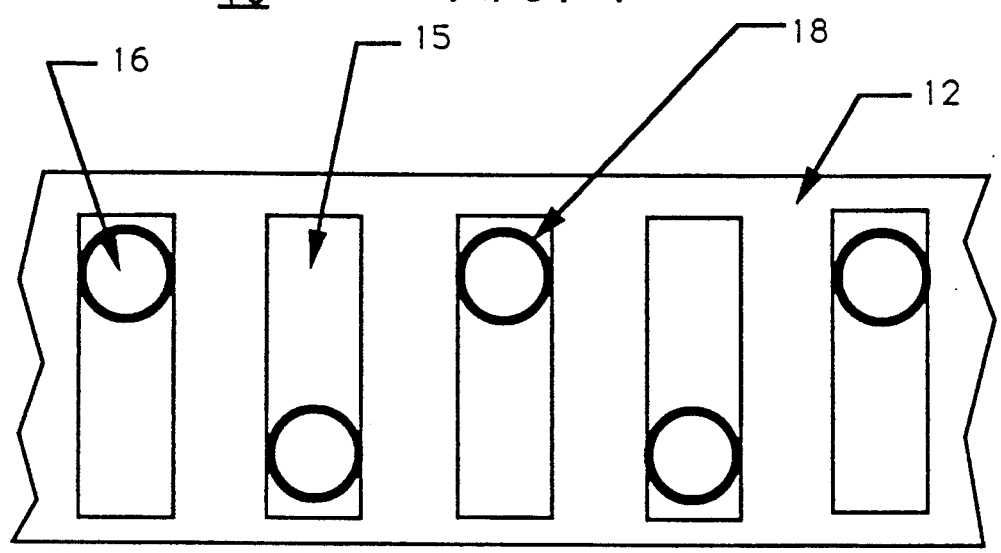
FIG. 1 is a top plan view of a substrate with predefined solder pads and solder spheres in accordance with the present invention.

Referring to FIG. 1 there is shown a substrate 12 with predefined solder pads 15 and solder spheres 16 in accordance with the present invention to create a substrate assembly 10. Although the present invention is most beneficial and suitable for finely pitched solder pads, the present invention is applicable to almost any solder pad wherein a uniform height (or volume per pad area) is most desirable. The solder pad 15 is solderable and could be finished with other high temperature solderable material such as copper, tin, lead, gold, silver or any combination thereof which is best suited to the particular substrate or printed circuit board (e.g., whether they are organic, inorganic, ceramic).

Figure 2:
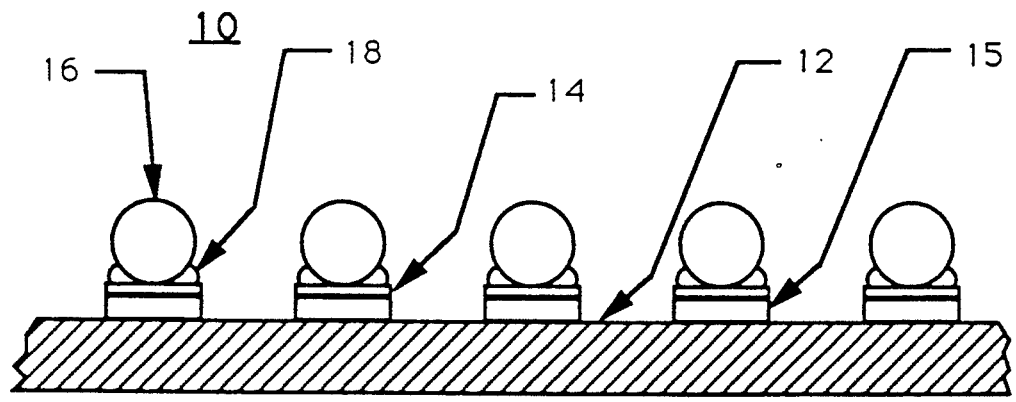
FIG. 2 is a side view of a substrate with predefined solder pads and solder spheres in accordance with the present invention.
Figure 3:
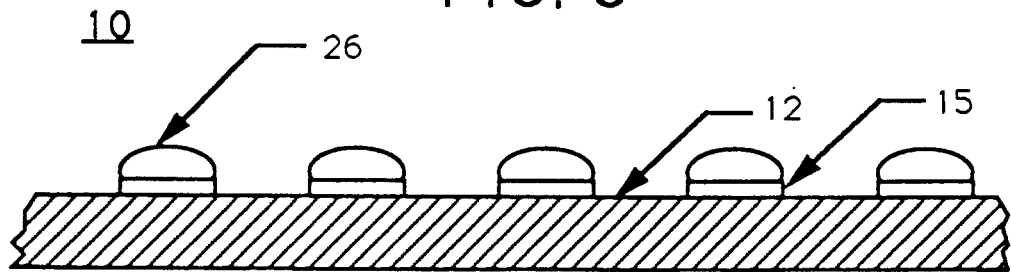
FIG. 3 is a side view of a substrate with reflowed solder in accordance with the present invention.

Referring to FIGS. 1 and 2, the process of applying solder in accordance with the present invention preferably begins by applying flux 14 to the solder pad 15. The flux 14 is preferably applied by spraying, but other means of applying flux are suitable for the present invention. Next, a tacking media 18 is applied to the solder spheres 16. Preferably, the solder spheres 16 are dipped into the tacking media in order to achieve an even coat. Applying flux 14 to the solder ball and tacking media 18 to the solder pad 15 is also within contemplation of the present invention. Regardless, the tacking media or the flux should not be a material that would add any volume to the solder sphere after reflow. The solder spheres 16 in fine pitched applications are preferably placed in alternative fashion at opposing ends of the solder pad as shown in FIG. 1 to reduce the chances of shorts between the pads. Furthermore, the solder spheres 16 should all be uniform in volume. After the solder spheres 16 are placed on the solder pads 15, the substrate assembly 10 is heated, preferably in a reflow oven. Referring to FIG. 3, after the solder spheres 16 are reflowed onto the solder pads 15, a reflowed solder pad 26 is created. The reflowed solder pads 26 should all be of a uniform height. Once the spheres 16 are reflowed, the geometry and volume of the resulting solder is extremely consistent and uniform from pad to pad. The other conventional methods of applying solder cannot consistently achieve this uniform height for several reasons. In screen printing solder paste, for instance, the stencil used in screen printing cannot prevent the inadvertent placement of unreflowed solder paste off of the solder pad. Furthermore, solder paste usually has a varying percentage of solids per unit volume which virtually prevents the creation of uniform volumes of reflowed solder per area of solder pad. Finally, other forms of discreetly dispensing solder are simply not accurate enough to provide a uniform height of reflowed solder. The uniform height of reflowed solder or the uniform volume of reflowed solder per pad area provided by the present invention cannot be overemphasized.

Figure 4:
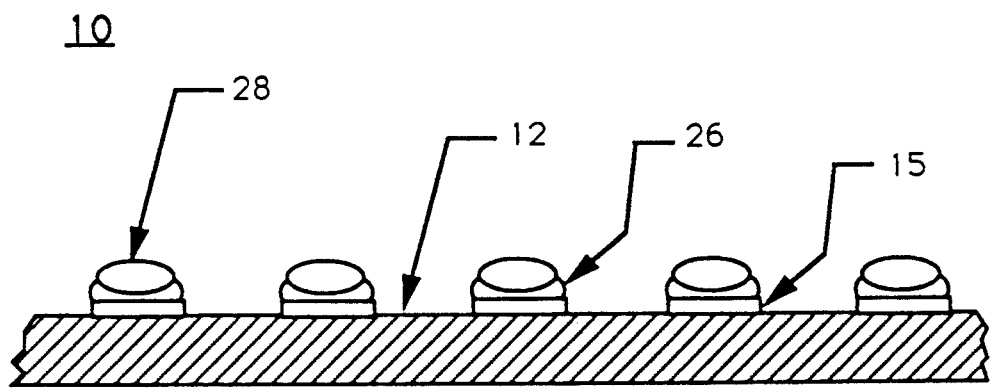
FIG. 4 is a side view of the substrate with reflowed solder of FIG. 3 with flux in accordance with the present invention.
Figure 5:
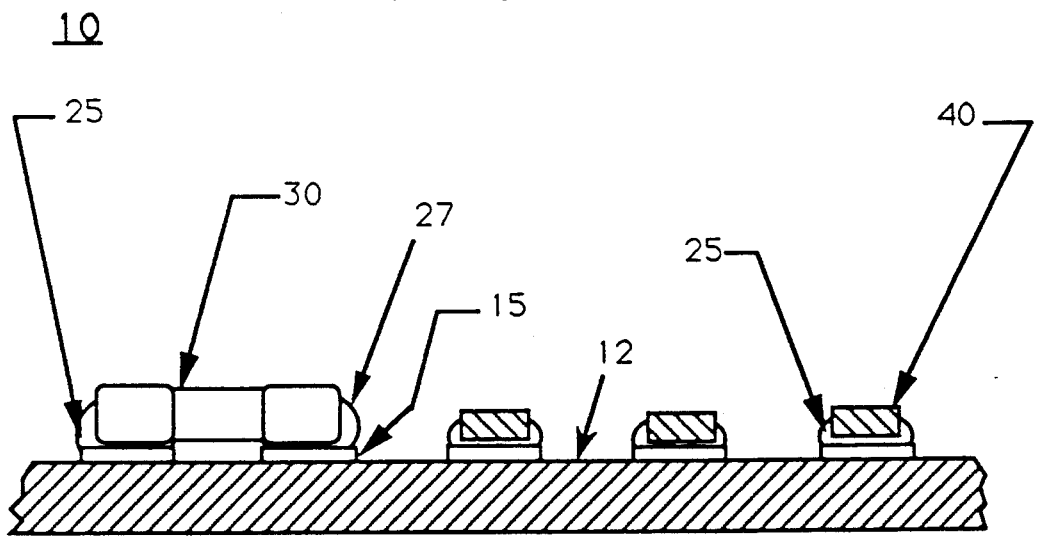
FIG. 5 is a side view of the substrate with surface mount components and leaded components in accordance with the present invention.

Referring to FIG. 4, after the creation of the reflowed solder pad 26, a layer of tacking media, or flux or a combination of flux and tacking media 28 flux tacking media is applied to the reflowed solder pad 26. Alternatively, referring to FIG. 5 the tacking media, flux or combination of flux and tacking media 28 could be applied to a surface mounted component 30 and then placed onto the reflowed solder pad 26 of FIG. 4. Preferably, a combination of flux and tacking media 28 is placed on the reflowed solder pad 26. Again, the flux, tacking media or combination of flux and tacking media should not add any appreciable volume to the reflowed solder pad 26 once the pad 26 is reflowed again. Then a component such as the surface mounted component 30 or a leaded component such as a quad flat pack (not shown) having leads 40 could be placed on the reflowed solder pad 26 having flux and tacking media 28. The components 30 or leaded packages (not shown) having leads 40 are preferably placed on the reflowed solder pads 26 (of FIG. 4) using an automated pick and place machine as is known in the art. Finally, the substrate assembly 10 is heated again, preferably in a reflow oven, creating solder joints 25 with superior soldering yields. The placement of fine pitch components and packages causes the leads to sit on the crown of the solder, wherein portions of the leads may not touch the solder. The subsequent reflow of solder allows the leads to "sink" into the solder joints 27 until a new seating plane is found on the solder pad and further creating solder fillets 25 that have a greater tendency of remaining on their intended solder pad area. Therefore, the portions of the leads previously not touching solder will also sink into the solder and form reliable solder interconnections.

What is claimed is:

1. A method for soldering a component to a substrate, comprising the steps of:
   (a) providing a substrate having predefined solderable metal pads;
   (b) providing solder spheres for suitable placement on the solderable metal pads;
   (c) applying a flux and a tacking media to the solderable metal pads;
   (d) dipping the solder spheres in the tacking media;
   (e) placing the solder spheres on the solderable metal pads;
   (f) heating and melting the solder spheres onto the solderable metal pads of the substrate providing reflowed solder on the solderable metal pads;
   (g) applying a layer of flux tacking media on the reflowed solder;
   (h) placing a component on the reflowed solder and flux tacking media providing a circuit assembly; and
   (i) heating the circuit assembly allowing the component to become soldered to the solder pad.

2. A method for soldering a component to a substrate, comprising the steps of:
   (a) providing a substrate having predefined solderable metal pads;
   (b) providing solder spheres for suitable placement on the solderable metal pads;
   (c) applying a flux and a tacking media to the solderable metal pads;
   (d) dipping the solder spheres in the flux;
   (e) placing the solder spheres on the solderable metal pads;
   (f) heating and melting the solder spheres onto the solderable metal pads of the substrate providing reflowed solder on the solderable metal pads;
   (g) applying a layer of flux tacking media on the reflowed solder;
   (h) placing a component on the reflowed solder and flux tacking media providing a circuit assembly; and
   (i) heating the circuit assembly allowing the component to become soldered to the solder pad.

3. A method for soldering a component to a substrate, comprising the steps of:
   (a) providing a substrate having predefined solderable metal pads;
   (b) providing solder spheres for suitable placement on the solderable metal pads;
   (c) applying a layer of flux to the solderable metal pads;
   (d) dipping the solder spheres in a tacking media;
   (e) placing the solder spheres on the solderable metal pads;
   (f) heating and melting the solder spheres onto the solderable metal pads of the substrate providing reflowed solder on the solderable metal pads;
   (g) applying a layer of flux tacking media on the reflowed solder;
   (h) placing a component on the reflowed solder and flux tacking media providing a circuit assembly; and
   (i) heating the circuit assembly allowing the component to become soldered to the solder pad.

4. A method for soldering a component to a substrate, comprising the steps of:
   (a) providing a substrate having predefined finely pitched solder pads, said solder pads being finished with a solderable material;
   (b) spraying a thin layer of flux over the substrate;
   (c) providing small diameter solder spheres for suitable placement on the solder pads;
   (d) dipping the solder spheres in a tacking media;
   (e) placing the solder spheres dipped in tacking media on the solder pads;
   (f) reflowing the solder spheres onto the solder pads of the substrate;
   (g) applying a layer of flux tacking media on the reflowed solder;
   (h) placing a fine leaded or pitched component on the reflowed solder and flux tacking media; and
   (i) reflowing the component and substrate allowing the component to be soldered to the solder pad.

5. The method of claim 4, wherein a substantially equivalent ratio between the area of the solder pads and the volume of the solder sphere exists on each of the solder pads on the substrate.

6. The method of claim 4, wherein said solder pads are finished with a metal selected from the group consisting of copper gold, tin, lead, silver, and any combinations thereof.

7. The method of claim 4, wherein the component is an electronic device selected from the group consisting of surface mounted components, quad flat packs, flip chips, semiconductor die and other semiconductor die carriers.

* * * * *